US006966440B1

(12) United States Patent
Kennedy et al.

(10) Patent No.: US 6,966,440 B1
(45) Date of Patent: Nov. 22, 2005

(54) TAPE-PACKAGED HEADED PIN CONTACT

(75) Inventors: Craig M. Kennedy, San Marcos, CA (US); Gregory K. Torigian, Garnerville, NY (US)

(73) Assignee: Autosplice Systems, Inc., San Diego, CA (US)

( * ) Notice: Subject to any disclaimer, the term of this patent is extended or adjusted under 35 U.S.C. 154(b) by 258 days.

(21) Appl. No.: 10/215,500

(22) Filed: Aug. 12, 2002

(51) Int. Cl.[7] .............................................. B65D 85/24
(52) U.S. Cl. ....................... 206/347; 206/341; 206/820
(58) Field of Search ................................ 206/713, 714, 206/716, 338, 341, 347, 820, 701; 411/442

(56) References Cited

U.S. PATENT DOCUMENTS

| | | | | |
|---|---|---|---|---|
| 5,046,610 A | * | 9/1991 | Runyon et al. | 206/713 |
| 5,101,975 A | * | 4/1992 | Runyon et al. | 206/713 |
| 5,499,717 A | * | 3/1996 | Hayashi | 206/701 |
| 5,648,136 A | * | 7/1997 | Bird | 428/76 |
| 5,690,233 A | * | 11/1997 | Kaneko | 206/714 |
| 5,747,139 A | * | 5/1998 | Schenz | 428/120 |
| 5,765,692 A | * | 6/1998 | Schenz | 206/713 |
| 5,931,298 A | * | 8/1999 | Huang | 206/346 |
| 6,003,676 A | * | 12/1999 | Beyer | 206/714 |
| 6,116,835 A | * | 9/2000 | Blacket et al. | 411/442 |

* cited by examiner

Primary Examiner—Jila M. Mohandesi

(57) ABSTRACT

A non-intrusive surface mount interconnect that provides a through-hole interconnect to the opposite side of a PCB board. A headed pin (head up/shank down) can be picked by standard placement equipment from a specially configured pocket tape using a hole that is tightly controlled for pin location. The head of the pin rests on top of the packaging tape preventing the pin from passing through the hole. A tapered section on the pin fits with minimal clearence assuring that a vacuum nozzle on the placement equipment when it descends sees and contacts the head top for vacuum nozzle pick-up.

10 Claims, 7 Drawing Sheets

TAPE-PACKAGED HEADED PIN CONTACT

The invention is directed to a solid through-hole pin for solder attaching into a preformed hole in a substrate, such as a printed circuit board (PCB) or the like.

BACKGROUND OF INVENTION

There are several approaches used in the electronic industry today that address how to solder attach a contact such as a pin to a PCB or other substrate (e.g., FR-4, ceramic, plastic, Teflon, metal etc.) using a solder paste and reflow process. These approaches include:

1. Interference Fit Pin Through Paste: This scheme uses a pin with an interference fit, such as when the pin is square and interferes with a round hole or has a protrusion/interference section along the shank of a round or square pin. The square pin or the interference section provides an interference fit when inserted into a hole of a PCB. Pre-deposited solder paste in or around the hole that the pin is inserted into provides a preferred solder joint when reflowed as would a secondary wave solder process. A problem with this approach is that it requires specialized insertion equipment and component packaging and processing. Also, pin interference can cause damage to the pins.
2. Surface Mount in Paste: In a conventional purely "top side", non-through hole application, solder paste is applied to a surface mount pad and a pin is placed onto the pad. The pin typically has a larger "foot" geometry, which is used to maximize the surface area for a preferred solder joint and stabilize the pin during the reflow process. The same problem with this approach exists, namely, it requires specialized equipment and packaging, and provides a single-sided pin interconnect only.
3. Compliant Pins: In this application, no solder is required and a spring-like interference fit is used to make contact to a plated through-hole in the PCB. Again, this approach requires specialized equipment and packaging.
4. Paste After Pin: In this scheme, an interference-fitted pin is inserted flush into the substrate, next the substrate is flipped or inverted, and then solder paste is deposited over the pin hole and reflowed. Again, this approach requires specialized equipment and packaging.

These standard approaches will not satisfy the requirements for a reliable soldered pin interconnect where very thin boards are used, or where an intrusive interference lit or second-sided surface mount processing can not be used. Second-sided surface mount processing means that the second side of the board is processed after the first side of the board has been processed to mount components or board interconnects or make connections.

Also, softer materials such as Teflon can not withstand the forces needed with interference pins to retain the pin into the plated through-hole of the bare board accurately. Still further, there are times when board hole diameter tolerances cannot be held tight enough for an interference fit with smaller pins. Also, the surface mount pin approaches require secondary processing when a pin interconnect is required from the second side of the board.

SUMMARY OF INVENTION

A principal object of the invention is a novel electrically-conductive contact member that can be reliably solder-mounted in substrate through-holes.

Another object of the invention is a novel male electrically-conductive contact member that can be reliably solder-attached to a through-hole in a thin or soft-material substrate without using an interference fit.

Still another object of the invention is a novel male electrically-conductive contact member that can be packaged for automatic placement by standard placement equipment.

These and other objects are achieved in accordance with one feature of the invention by a novel electrically-conductive contact member, characterized by a shank sized for a loose fit in a substrate through-hole and topped by a head whose diameter exceeds that of the through-hole. The head can be used by an industry standard pick-up nozzle of standard SMT placement equipment to conveniently drop the contact member into the board through-hole, with the head resting on the substrate surface.

In accordance with another feature of the invention, the contact member is packaged in a novel tape configured with a hole located to receive the contact shank such that the center line of the contact can be aligned with the center line of the hole in the tape to ensure successful vacuum nozzle pick. Preferably, the contact member is a metal pin.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals or letters signifying the same or similar components.

DETAILED DESCRIPTION OF PREFERRED EMBODIMENTS

The contact member of the invention can be fabricated with different cross-sections, such as round, square, rectangular, and octagonal, etc.

Figure 1:
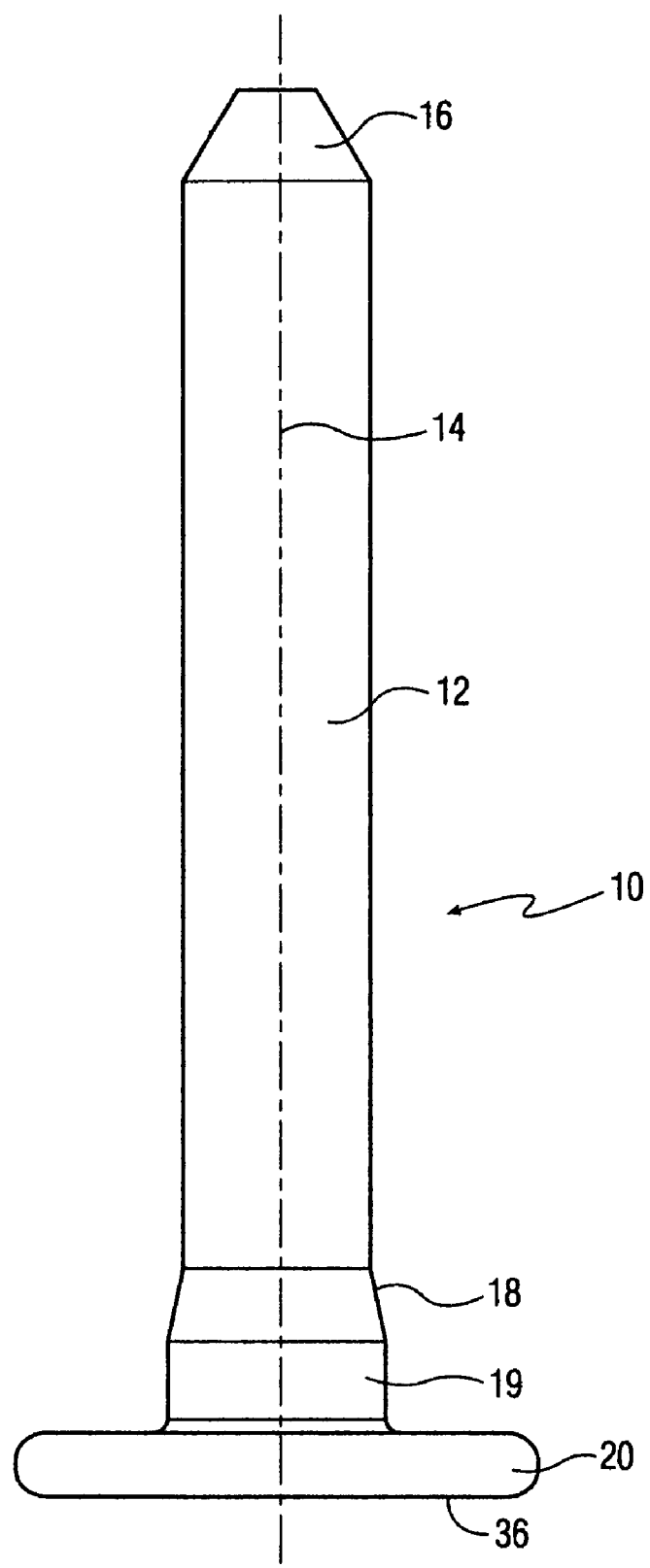
FIG. 1 is a front elevational view of one form of headed contact pin in accordance with the invention.

FIG. 1 illustrates one form of round pin member comprising an elongated shank section having a central axis and topped off with a larger diameter head. Between the head and the shank is an intermediate tapered section whose outer diameter tapers outwardly from that of the shank. The most important application of the invention is the provision of metal pins for mounting by standard SMT placement equipment into holes of a PCB or other substrate. However, the invention is not limited to metal pins, nor to PCBs. The invention can be used with any kind of substrate that has openings into which a projecting member needs to be mounted by placement in the holes. While a common purpose would be to establish an electrically-conductive contact between an electrically-conductive portion on the contact member and an electrically-conductive part on the substrate, the latter need not be on the walls of the hole but could be a pad or other electrically-conductive member on a surface of the substrate surrounding the hole. The invention can also be applied to projecting members from sockets or clips that can use the headed section of the invention for mounting of the socket or clip on a substrate. However, to simplify the description, with the understanding that the invention is not so limited, the invention will be described and illustrated in the most common application employing in this case, as a contact member, a male electrically conductive pin 10, intended to receive a female connector 50 for establishing an electrical connection between a wire or component or trace connected to the female connector and a component on a PCB and connected via a conductive trace to the pin 10.

In the embodiment illustrated in FIG. 1, the male pin 10 comprises an elongated cylindrical metal shank 12 of uniform cross-section having a longitudinal axis 14 and having a beveled end 16 at its bottom and a tapered section 18 leading to a cylindrical section 19 and finally to its head 20 at the top. The combined length of the tapered section 18 and cylindrical section 19 preferably has an axial length about 1/10 or less of the overall pin length, and the combined length of the tapered section 18 and cylindrical section 19 has an axial length exceeding that of the head 20 and shorter than that of the shank 12. Preferably, the head 20 has a flat top 36.

Figure 2:
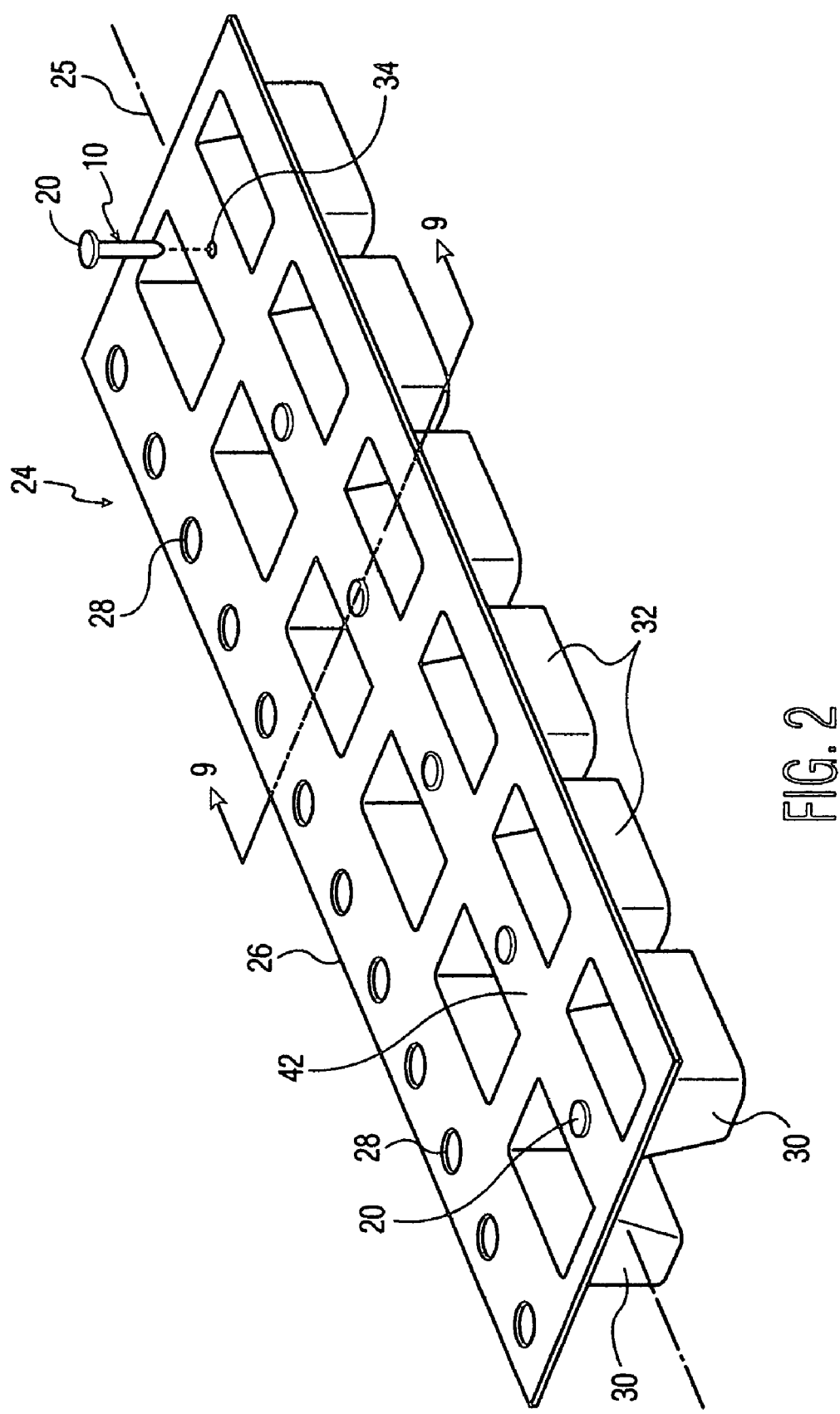
FIG. 2 is a perspective view of part of tape and reel packaging according to the invention with several headed pins in accordance with the invention in place on the tape as well as one pin positioned over the tape top to show how the pin can be mounted on or into the tape as well as how it can be removed from the tape.
Figure 3:
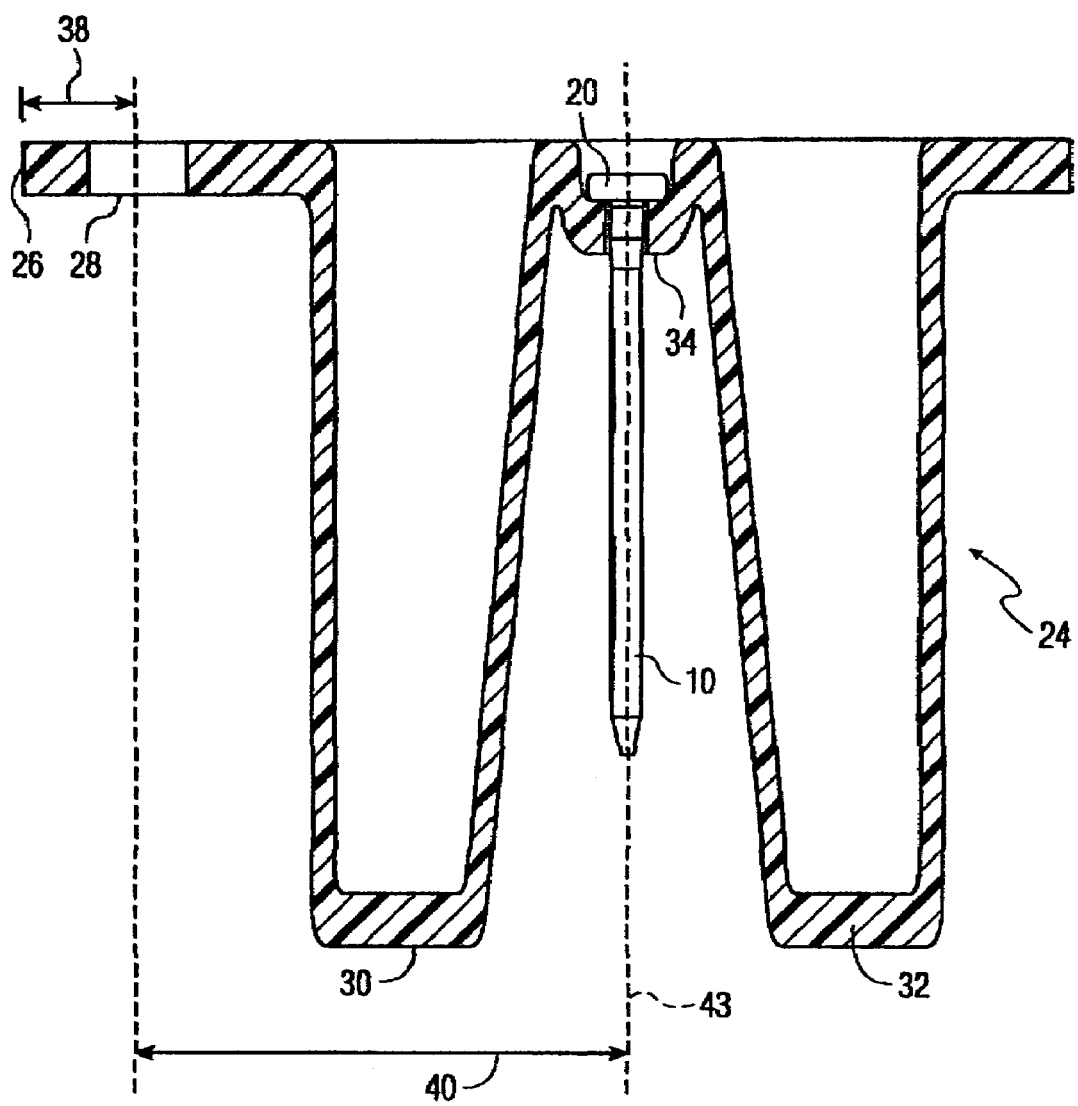
FIG. 3 is a cross-sectional view similar to FIG. 9 of an embodiment in which the pin head is positioned in a recess below the topmost surface of the carrier.

The configuration of the pin 10 is closely related to the configuration of the packaging tape that supports typically in reel form a large number of such pins for individual removal and placement as is well known by standard placement equipment. FIGS. 2 and 3 are partial views of one form of elongated tape 24 in accordance with the invention designed for accommodating a large number of pins and that can be reeled up and supplied in reel form for automated placement to the PCB. The tape is typically many feet long. The elongation or longitudinal axis is indicated by reference numeral 25. As is typical of such packaging tapes 24 for loose components, an edge 26 of the tape 24 is provided with a series of sprocket holes 28 extending in the direction of the axis 25 by means of which the tape 24 can be reeled and unreeled by automatic feeder equipment. As illustrated in the cross-section of FIG. 3, along a series of axially-spaced parallel imaginary lines extending across the width of the tape (parallel to the cross-sectional view), starting from the sprocket holes 28, are provided two protective tape sections 30, 32 flanking a receiving hole 34 for a pin 10. FIG. 3 also shows the pin 10 mounted in the receiving hole 34.

The protective flanking tape sections 30, 32 have a height (vertically in FIG. 3) exceeding that of the mounted pin 10 such that they protect the pin 10 while on the tape 24 from inadvertent contact and displacement during the reeling, shipping/handling, and unreeling processes. The exact shape of these flanking sections 30, 32 is not important. They are preferably formed in the tape (typically of a suitable plastic) as depending U-shaped or V-shaped sections by any suitable process. The pin holes 34 are preferably formed in a non-drawn tape section in the original tape thickness for more accuracy and to increase strength and stability. This is important to ensure that the lateral spacing 40 (in the plane of FIG. 3) between the sprocket holes 28 and the pin-receiving holes 34 is maintained accurately within a very tight tolerance, for example, of at most 0.003 inches.

The position of the sprocket holes 28 can be accurately determined with respect to the unreeling equipment by either employing sprocket teeth on the sprocket drive wheel (not shown) that engage the sprocket holes 28 with an interference fit, or by providing a braking action on the tape as it is pulled in a manner well-known to keep the tape taut. By accurately locating laterally the pin-receiving holes 34 with respect to the sprocket holes 28, and by accurately locating the placement machine nozzle pick-up axis with respect to the unreeling equipment and thus the same sprocket holes 28, it is ensured that the machine pick-up axis will be accurately aligned with the pin head 20 to ensure that the vacuum nozzle when it descends sees and contacts the head top 36 for successful vacuum nozzle pick-up. As one example, which is not intended to be limiting, for a pin having a shank diameter of 0.028 inches, the center lines of the sprocket holes are positioned about 0.069 inches (with a tolerance of about 0.00175 inches) from the tape edge [indicated in FIG. 3 by reference numeral 38], and the center line of the pin-receiving holes 34 is positioned about 0.295 inches (with a tolerance of about 0.0075 inches) from the center lines of the sprocket holes 28.

The headed pin 10, when dropped into such a receiving hole 34 that is controlled for pin location, is supported pin side down on the top surface 42 of the tape, the head 20 of the pin 10 resting on top of the packaging tape 24 preventing the pin from passing through the hole, and the pin shank 12 underneath is completely bounded laterally by the protective sections 30, 32. As shown in FIG. 3, preferably the tape surface supporting the pin head is recessed so that the pin top is flush with or just below the outer tape surfaces, which minimizes the overall tape thickness. The tapered section 18 fits with minimal clearance in the tape hole 34 and helps centering of the pin in the hole 34 thereby aligning the pin axis 14 with the hole axis 43 further assuring that the center line 14 of the pin is aligned with the center line of the hole in the tape, again to ensure successful vacuum nozzle pick. FIG. 2 also shows at the far end a pin 10 separated from its receiving hole 34. The mechanism for dropping the pin into the tape hole or for removing the pin from the tape can be standard placement equipment and is not shown as well known in the art. It will be understood that the pins fit loosely in their respective tape holes, held in place by gravity when the tape is horizontal, and can if desired be covered on top by a conventional cover tape to retain the pins during reeling. The cover tape is removed when the tape is unreeled so that the pins can then be removed.

When a pin 10 is removed from the tape 24 by the placement equipment, it is dropped into a slightly oversized hole in the PCB in the same manner that it was initially dropped into the tape-receiving hole. Typically, the pin is picked, passed by the vision camera on a standard placement machine, and then stationed over the pre-pasted hole and targeted so that the shank of the pin is placed through the hole with no interference fit to the plated through hole. The under side of the pin head may be pushed or dropped into the paste. The enlarged head 20 rests on the board surface, considered as the board itself or any solder paste on the board surface.

Figure 4:
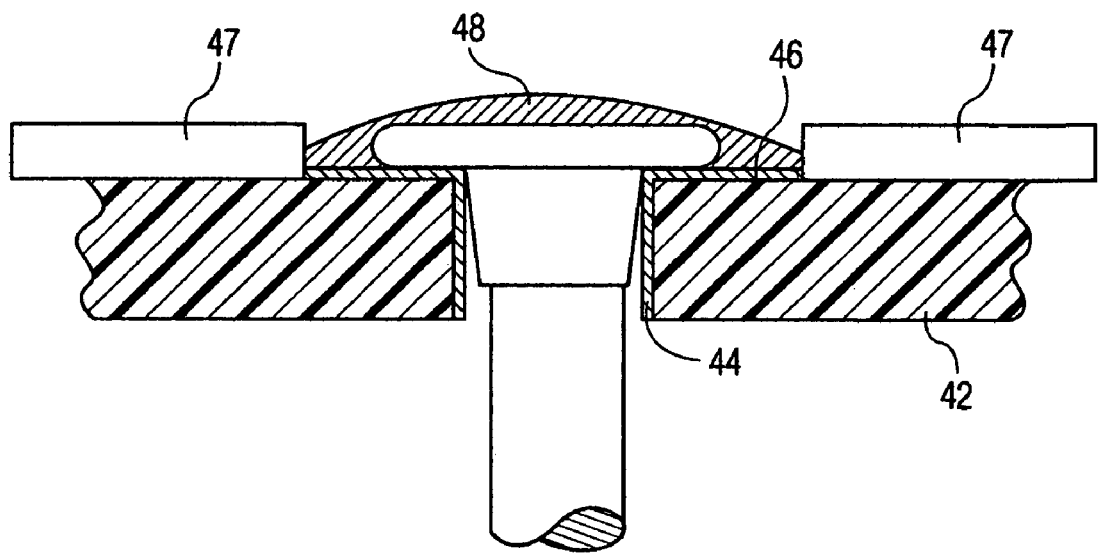
FIG. 4 is a partial cross-sectional view of the upper part of the pin after soldering to a PCB.

Under the head of the pin, the tapered section 18 (larger than the shank) has been configured to help locate the center line of the pin to the center line of the plated through hole during placement. The board hole preferably has a hole diameter exceeding that of the widest part 19 of the tapered section 18 so that the pin 10 when dropped into the board hole will rest with its head on the board surface. This is illustrated in FIG. 4, which shows at 42 part of a PCB with a plated through-hole 44. The plating 46 extends over the top surface of the board. The structure surrounding the pin head 20 is a temporary solder stencil 47 used as a mask to control the location of the solder paste 48 over the hole (before the pin is mounted) and the adjacent plating sections 46. Preferably, some solder paste 48 is also placed inside the hole defined by the solder screen 47, and during the reflow process, suitably fluxed, the solder paste typically flows around the pin and forms the desired solder fillet completely around the head of the pin. The solder will wick into the plated board hole 44 (not shown) as well as over the plated extension 46 and will typically also creep over the pin head 20 as shown at 48'. The result is a non-intrusive, i.e., non-interference fit, surface mount interconnect that provides a through-hole interconnect, i.e., the pin shank 12, on the opposite (bottom) side of the board 42.

Figure 5:
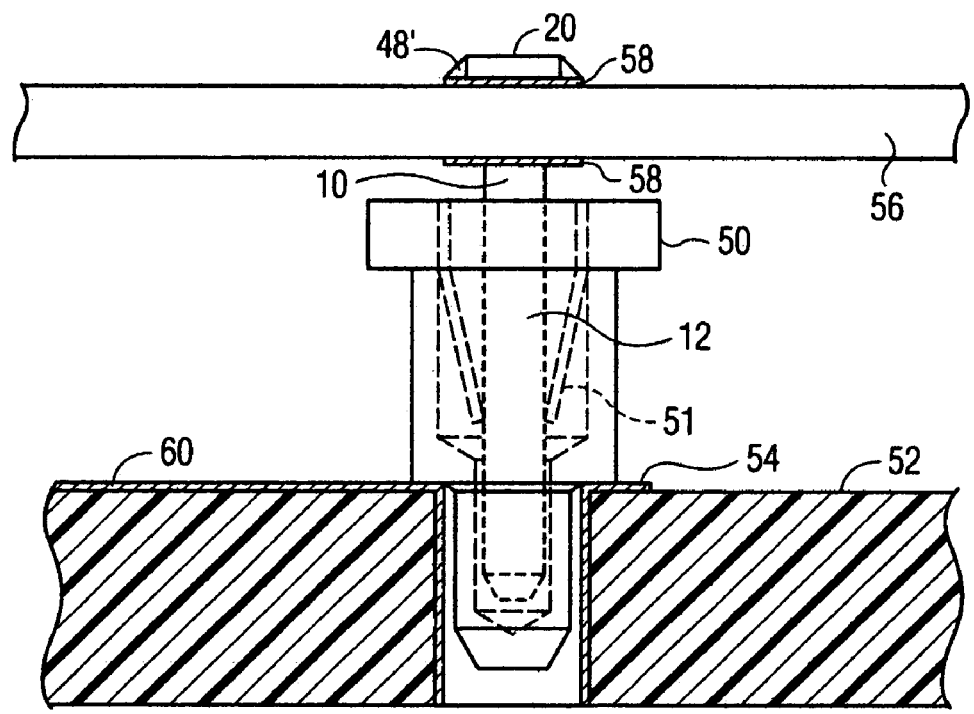
FIG. 5 is a partial cross-sectional view of part of the PCB of FIG. 4 shown mounted to a socket on an underlying PCB.

FIG. 5 shows, for example, one application for a PCB/pin assembly of the type shown in FIG. 4. A socket 50 is soldered in a conventional manner into a motherboard 52 plated through-hole 54. The socket 50 is configured 51 to receive the shank 12 of the headed pin 10 soldered as described above to, for example, a daughter board 56. When the pin 10 or an array of such pins is plugged into the socket 50 or a matching array of such sockets, then each of the pins 10 and whatever components it may be connected to via traces 58 on the daughterboard's upper/lower surfaces are then electrically connected via the socket 50 to whatever components it may be connected to via traces 60 on the motherboard's surfaces. The pins of course can also be directly soldered to the plated through-holes 54 in the motherboard using a lower temperature solder.

Summarizing, to address the problem of providing a reliable soldered pin attachment to a thin substrate (e.g., of FR-4, ceramic, plastic, Teflon, metal etc.) or of soft material using standard packaging formats with standard equipment, a non-interference fit pin interconnect can be used. This non-intrusive approach can also be used for standard board thicknesses and the same or other materials and thicknesses. The unique design using standard tape and reel packaging format allows accurate location of the pin to be picked and placed to a pre-pasted through-hole in the printed circuit board/substrate using standard placement equipment. Placement of a headed pin onto a pre pasted double sided plated through hole or if desired a single sided annular ring can be accomplished by simply "picking" a headed pin (head up/shank) from the novel packaging format described above. The headed pin is packaged pin side down into the novel pocket tape using a hole that is tightly controlled for pin location.

Any solderable material, such as copper or copper alloy, brass, and phosphor bronze, can be used in this pin application. The overall pin lengths can cover a wide range, for example, from 0.25–2 inches. The invention is especially important for miniature pins, having nominal pin diameters of 0.045 inches or less in both the square and round configurations.

In addition to the advantages set forth above, the pins may be placed in the PCB hole and removed before soldering or after, and re-used several times without damage to the hole or to the pin. A pin construction that provides good retention without sacrificing pin strength, especially for miniature pins, is also taught herein.

Figure 6:
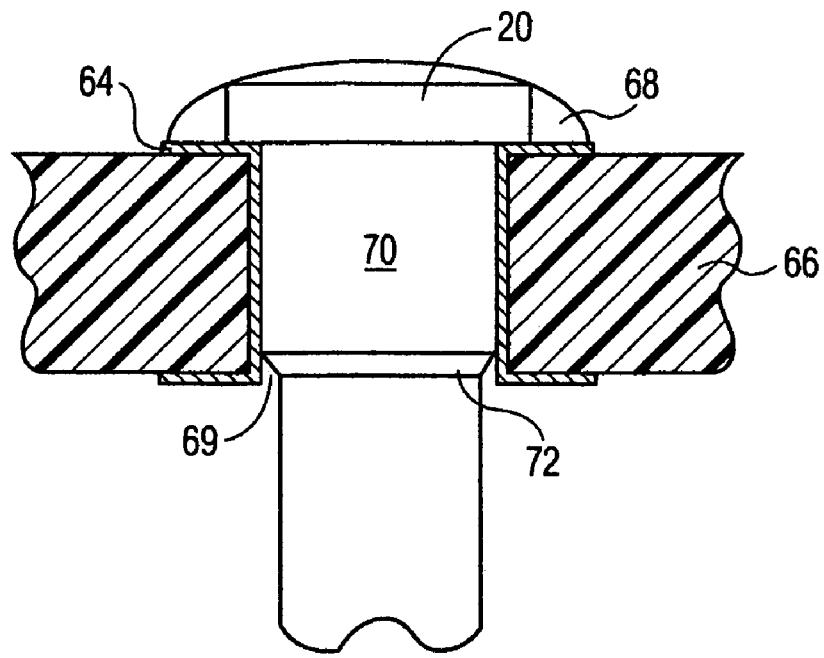
FIG. 6 is a partial cross-sectional view of the upper part of a pin according to the invention after soldering to a PCB in a variation.
Figure 7:
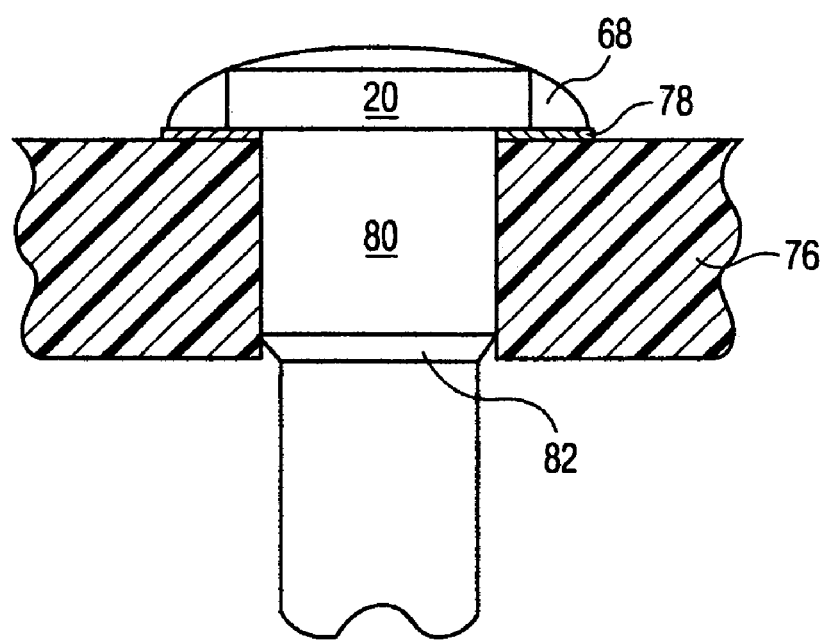
FIG. 7 is view similar to FIG. 6 of another variation

FIGS. 6 and 7 show variations. In the FIG. 6 embodiment, the through-hole plating 64 extends on both sides of the double-sided board 66, the reflowed solder 68 covers the head 20 and also fills the board hole 69, and the cylindrical section 70 below the head 20 has been increased in length and the conical section 72 below correspondingly decreased. In the FIG. 7 variant, a single-sided board 76 is shown, the plating 78 is present only on the top side of the board, and thus the reflowed solder 68 will be confined to the metallic surfaces of the plating 78 and head 20. The relative length ratio of the adjacent cylindrical 80 and conical 82 sections are closer to the preferred ratio shown in FIG. 1.

Figure 8:
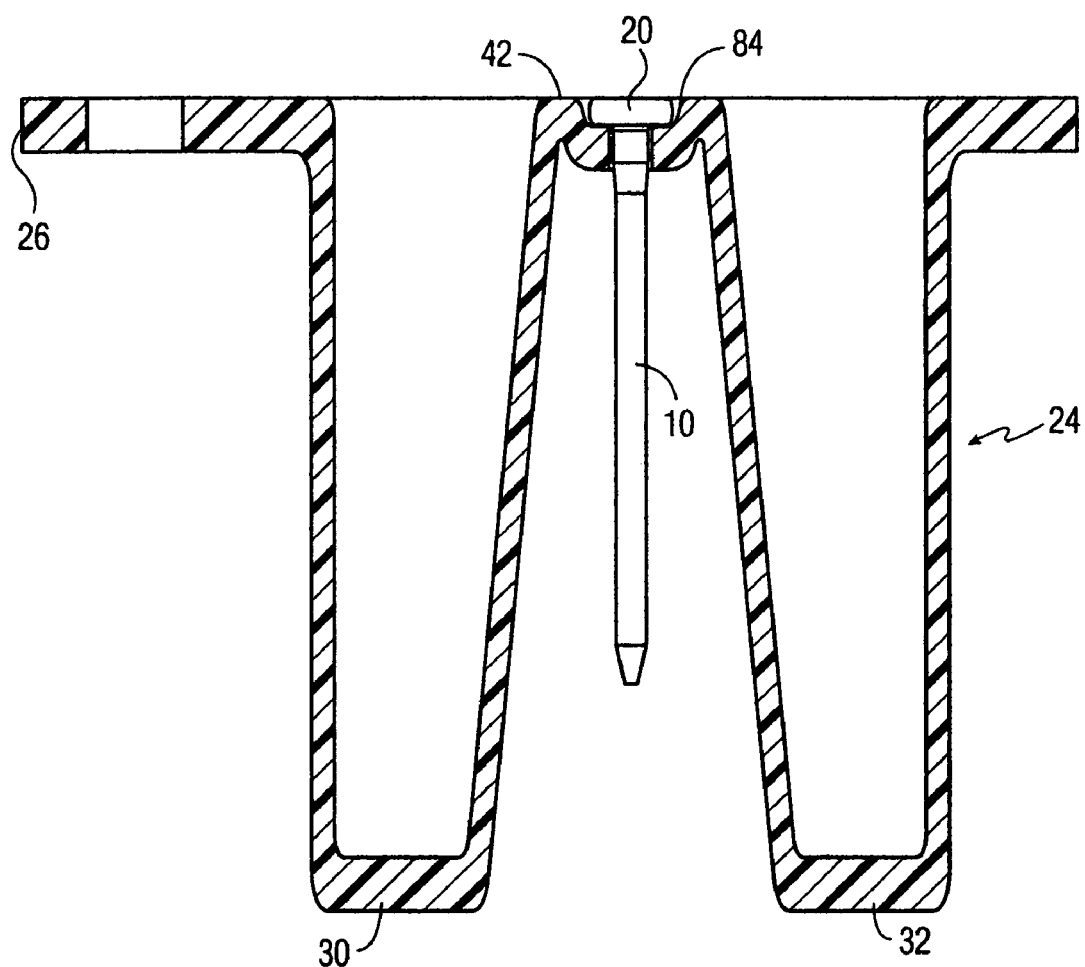
FIG. 8 is a cross-sectional view similar to FIG. 9 of an embodiment in which the pin head top is flush with the topmost surface of the carrier.
Figure 9:
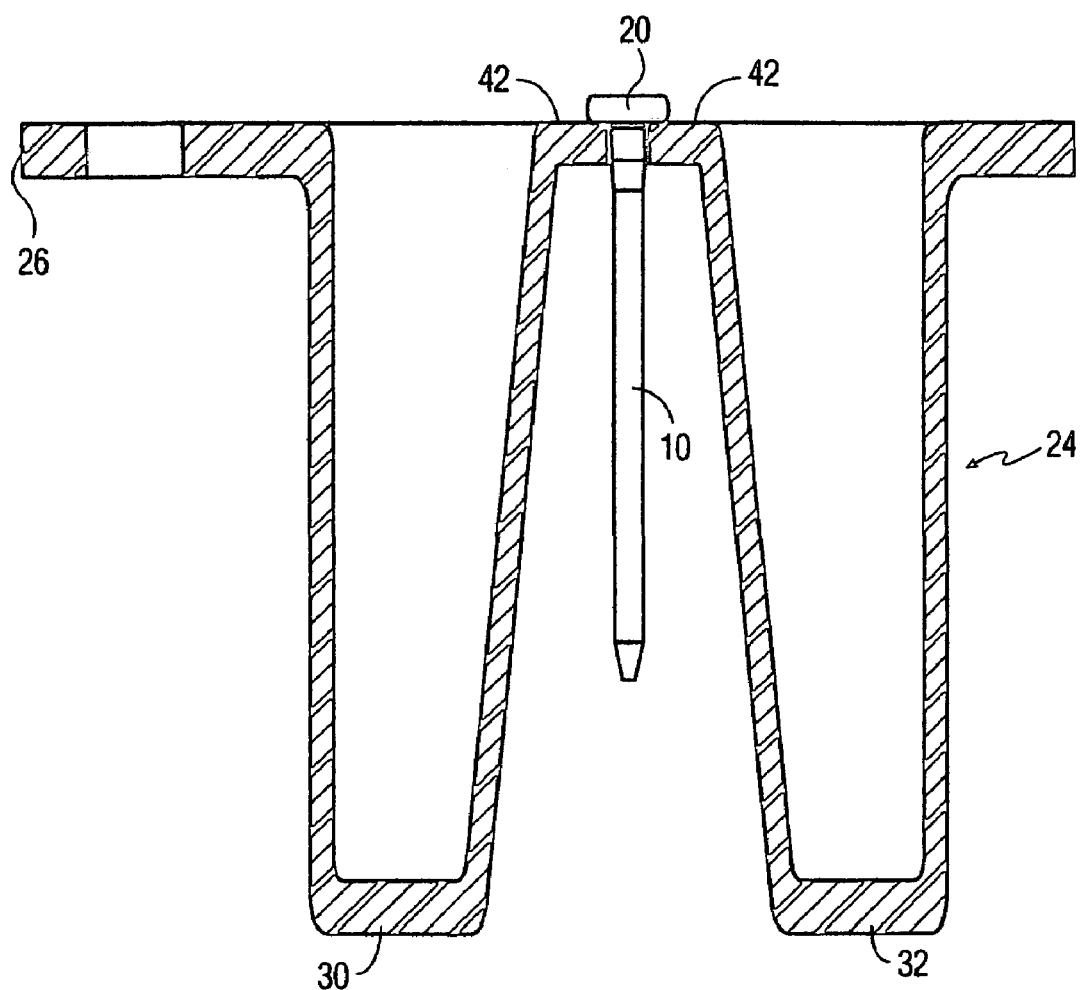
FIG. 9 is a cross-sectional view along the line 9—9 of FIG. 2.

FIGS. 8 and 9 are similar to FIG. 3, but illustrate variations. In FIG. 8, the recess 84 for the pin head 20 is shallower than in FIG. 3 and thus the pin head 20 top surface is flush with the top surface 42 of the tape carrier 24. In the FIG. 9 variation, there is no recess for the pin head 20 and thus the pin head 20 sits on the top surface 42 of the tape carrier 24.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A packaging tape for contact members, comprising a tape of sheet material having a longitudinal direction and a flat section along one edge of the tape, the flat section having opposed top and bottom surfaces, a series of sprocket holes extending longitudinally adjacent said one edge of the tape, a series of longitudinally-spaced through-holes extending longitudinally along a portion of the tape located at substantially the same level as that of the flat section and spaced inwardly of the series of sprocket holes and parallel to and laterally spaced from the series of sprocket holes, a protective section bordering each of the through-holes and depending below the bottom surface of the flat section of the tape in a direction perpendicular to the top and bottom surfaces of the tape, the protective section comprising two spaced depending sections flanking the sides of each of the through-holes and extending a substantial distance below the portion of the tape where the through-holes are located, such that a contact member when placed in a through-hole and extending below the bottom surface of the tape will be protected by the two depending sections flanking the sides of the contact member.

2. A packaging tape according to claim 1, wherein each of the through-holes is spaced laterally from the series of sprocket holes by the same predetermined distance.

3. A packaging tape according to claim 2, wherein the portion of the tape containing the series of through-holes is recessed.

4. The packaging tape according to claim 1, wherein the series of sprocket holes is laterally spaced a predetermined distance from the centers of the through-holes.

5. The packaging tape according to claim 4, wherein the series of sprocket holes is laterally spaced a predetermined distance from the one edge of the tape.

6. In combination:

i) a packaging tape for contact members comprising:

(a) an elongated tape of sheet material having a longitudinal direction and opposed major top and bottom surfaces defining side edges of the tape and substantially flat first and second sections adjacent one side edge of the tape and spaced inwardly from the one side edge, respectively, a series of sprocket holes extending longitudinally along the first section of the tape, (b) a series of through-holes extending longitudinally along the second section of the tape and extending inwardly of the series of sprocket holes and parallel to and laterally spaced from the series of sprocket holes, (c) a protective section bordering each of the through-holes and depending from the tape in a direction perpendicular to the major tape surfaces and below the second section;

ii) a plurality of contact members each comprising a head section and a shank section, each contact member being loosely seated into one of the tape through-holes with its shank section extending below the bottom tape surface adjacent but laterally spaced from the protective section and its head section resting on the top surface of the tape.

7. The combination according to claim 6, wherein the head sections of the contact members are positioned in a section flush with or in a recessed section just below the tape top surface.

8. The combination according to claim 7, wherein the protective section comprises two spaced depending sections adjacent and flanking each contact member, and the length of the depending sections exceeds that of the adjacent shank section.

9. The combination according to claim 8, wherein the series of sprocket holes is laterally spaced a predetermined distance from the centers of the through-holes, and the series of sprocket holes is laterally spaced a predetermined distance from the one edge of the tape.

10. A packaging tape for contact members, comprising an elongated tape of sheet material having a longitudinal direction and opposed major top and bottom surfaces, a series of sprocket holes extending axially along one edge of the tape, a series of through-holes extending through the tape from its top surface and extending axially along a portion of the tape extending inwardly of the series of sprocket holes and parallel to and laterally spaced from the series of sprocket holes, a protective section flanking each side of the through-holes and depending from the tape in a direction perpendicular to and below the tape bottom surface, each of the protective sections flanking one side of the through-holes and having a generally U-shaped cross-section and each being spaced from another protective section having a generally U-shaped cross-section flanking the other side of the through-holes.

* * * * *